United States Patent [19]

Lee

[11] 4,395,348
[45] Jul. 26, 1983

[54] PHOTORESIST STRIPPING COMPOSITION AND METHOD

[75] Inventor: Wai M. Lee, Milpitas, Calif.

[73] Assignee: EKC Technology, Inc., Hayward, Calif.

[21] Appl. No.: 323,724

[22] Filed: Nov. 23, 1981

[51] Int. Cl.$^3$ .......................... C11D 7/26; C11D 7/34
[52] U.S. Cl. .................................... 252/143; 252/146; 252/148; 252/151; 252/162; 252/170; 252/171; 252/549; 252/556; 252/558; 252/559; 134/3; 134/38; 134/40; 134/41; 134/42; 568/763; 430/329; 430/331
[58] Field of Search ............... 252/142, 143, 146, 148, 252/151, 162, 170, 171, 549, 556, 558, 559; 134/3, 38, 40, 41, 42; 568/763; 430/329, 331

[56] References Cited

U.S. PATENT DOCUMENTS

| | | | |
|---|---|---|---|
| 3,530,186 | 9/1970 | Greco | 568/763 |
| 3,582,401 | 6/1971 | Berilla et al. | 252/171 |
| 4,165,294 | 8/1979 | Vander Mey | 252/171 |
| 4,215,005 | 7/1980 | Vander Mey | 252/171 |
| 4,221,674 | 9/1980 | Vander Mey | 252/558 |
| 4,242,218 | 12/1980 | Vander Mey | 252/171 |

*Primary Examiner*—John E. Kittle
*Assistant Examiner*—Robert A. Wax
*Attorney, Agent, or Firm*—Julian Caplan

[57] ABSTRACT

An organic photoresist stripping composition especially for use with silicon wafers having an insulating layer and metallization on the wafers contains an organic sulfonic acid and 1,2 dihydroxybenzene. The composition also preferably includes a polar or nonpolar, organic solvent. This composition will remove both positive and negative photoresist from wafers without attack on either aluminum metallization or silicon dioxide insulation layers when used to contact the photoresist on the wafers.

10 Claims, No Drawings

PHOTORESIST STRIPPING COMPOSITION AND METHOD

BACKGROUND OF THE INVENTION

1. Field of the Invention

This invention relates to a novel phenol-free photoresist stripping composition and method, particularly useful in the fabrication of integrated circuits. More particularly, it relates to such a stripping composition and method which is useful for both positive and negative photoresist, and which is free of compounds that have presented safety and environmental problems in prior art photoresist stripping compositions and methods.

2. Description of the Prior Art

In integrated circuit manufacturing, various compositions have been used for stripping organic photoresist polymers from silicon dioxide and other insulator surfaces, as well as metallized silicon dioxide or other insulator surfaces. The photoresist strippers currently in most general use, including 712D photoresist stripper available from the assignee of this application, J-100 photoresist stripper, available from Indust-Ri-Chem, and A-20, A-30 and A-40 photoresist stripper, available from Allied Chemical Corporation, are mixtures of certain organic sulfonic acids, phenol and chlorinated hydrocarbon solvents. A further description of the Allied Chemical compositions is contained in U.S. Pat. No. 4,165,295, which discloses the addition of fluoride ion to a stripping composition to help prevent attack on aluminum. A problem associated with the fluoride ion is that it will attack silicon dioxide.

As a result of safety and environmental problems associated with the chlorinated hydrocarbon solvents and phenol, it is desired to provide suitable replacements for these components of the compositions. Various photoresist stripper compositions have been offered to the semiconductor industry which do not contain phenol, but they have not proved as suitable in practice as the above compositions. Some of these substitute compositions are also acid-free, but those compositions are effective only on positive photoresist.

An effective replacement for the generally used above photoresist stripping compositions should meet the following criteria: The composition should be phenol and chlorinated hydrocarbon solvent-free, it should be water rinsable, non-corrosive to silicon, silicon dioxide, aluminum, aluminum silicon alloys, aluminum copper alloys, nickel chromium alloys and gold under normal operating conditions.

Thus, while the art of photoresist stripping compositions and methods is a well developed one, a need still remains for a suitable replacement stripping composition and method for the compositions and methods currently in general use in the semiconductor industry.

SUMMARY OF THE INVENTION

Accordingly, it is an object of this invention to provide a photoresist stripping composition and method which is free of phenol and chlorinated hydrocarbon solvents, and compatible with the metals and insulating layers commonly employed in integrated circuits.

It is another object of the invention to provide such a composition and method which is free of attack on aluminum or silicon dioxide.

It is a further object of the invention to provide such a composition and method which will give stripping results at least comparable to that obtained with the use of commercially available photoresist stripping compositions containing phenol or a chlorinated hydrocarbon solvent.

It is still another object of the invention to provide such a photoresist stripping composition and process which is suitable for use with both positive and negative photoresists.

The attainment of these and related objects may be achieved through use of the novel photoresist stripping composition and process herein disclosed. A photoresist stripping composition in accordance with the invention includes an organic sulfonic acid and 1,2 dihydroxybenzene. The organic sulfonic acid should be present in an amount of from about 20 to about 90 weight percent of the composition. The 1,2 dihydroxybenzene should be present from about 0.1 to about 20 weight percent of the composition. The composition may additionally include an organic solvent, polar or non-polar, typically in an amount of from about 1 to about 60 weight percent of the composition.

The method for stripping photoresist from a substrate of this invention comprises contacting the photoresist with the above composition at a temperature between about 20° and about 150° C. The composition is allowed to contact the photoresist for times of from about 15 seconds to two hours or more, depending on the photoresist employed and the curing conditions used with the photoresist.

While applicant does not wish to be bound by any particular theory of operation, it is believed that the 1,2 dihydroxybenzene utilized in the composition and method of this invention acts both as a corrosion inhibitor for aluminum, iron and other metals, and as a retardant for formation of polymeric residue deposits on the metal surfaces during high temperature processing used in stripping photoresist from integrated circuits. With use of the 1,2 dihydroxybenzene, the composition and method of this invention need not employ phenol or a chlorinated hydrocarbon solvent.

The attainment of the foregoing and related objects, advantages and features of the invention should be more readily apparent to those skilled in the art, after review of the following more detailed description of the invention.

DETAILED DESCRIPTION OF THE INVENTION

Suitable examples of organic sulfonic acids that may be utilized in the composition and method of this invention include aryl sulfonic acids and alkylaryl sulfonic acids, such as toluene sulfonic acid, xylene sulfonic acid, dodecylbenzene sulfonic acid, and the like. Other examples of operable organic sulfonic acids are included in the above referenced U.S. Pat. No. 4,165,295. The preferred range for the amount of the organic sulfonic acid present in the composition is from about 30 to about 60 weight percent, with about 35 weight percent being especially preferred.

The preferred range for the amount of 1,2 dihydroxybenzene in the composition is from about 3 to about 15 weight percent of the composition, with about 5 weight percent of 1,2 dihydroxybenzene being especially preferred.

Suitable nonpolar, organic solvents for use in the composition and method of this invention include aromatic hydrocarbons containing 6 to 14 carbon atoms, such as benzene, and the like; aliphatic hydrocarbons containing one to 30 carbon atoms, such as n-pentane, n-octane, dodecane, and the like; monoalkyl-substituted aromatic hydrocarbons, such as toluene, ethyl benzene, cumene, octylbenzene, decylbenzene and dodecylbenzene; dialkyl substituted hydrocarbons containing eight to 20 carbon atoms, such as the ortho, meta and para isomers of xylene and diethylbenzene; trialkyl-substituted aromatic hydrocarbons containing 9 to 20 carbon atoms, such as the 1,2,3-; 1,2,4- and 1,3,5-isomers of trimethyl and triethylbenzene; suitable polar organic solvents include aliphatic ketones containing three to 10 carbon atoms, such as acetone, methylethylketone and methylisobutylketone; monoalkyl ethers of ethylene glycol containing three to 10 carbon atoms, such as ethoxyethanol and butoxyethanol; carboxylic acids containing one to four carbon atoms, such as acetic and maleic acid; formamide; N,N-dialkylalkanonylamides containing three to 10 carbon atoms, such as dimethylformamide and dimethylacetamide; N-alkyl lactams containing six to 12 carbon atoms, such as N-methylpyrrolidone; cyclic aliphatic sulfones containing four to 6 carbon atoms, such as tetramethylenesulfone; and the like. The preferred nonpolar, organic solvents are xylene, toluene, isopropylnapthalene, and decalin. The preferred polar solvents are dimethyl formamide, N-methyl pyrollidone, and sulfolane. If present, the solvent desirably comprises from about one to about 60 weight percent of the composition.

The composition of this invention is suitable for use with all of the commonly employed positive and negative photoresists used in the semiconductor industry, including Kodak 747 and 752 negative photoresist; Hunt Chemical Waycoat Photoresist, both their positive HPR photoresist and their negative HNR 999 photoresist; Merck Chemical Selectilux photoresist, MacDermid negative photoresist, Shipley AZ series positive photoresist; KTI positive and negative photoresist; Dyna-Chem Thiokol OMR and OPR photoresist; and the like.

The following non-limiting examples represent preferred forms and best modes contemplated by the inventor for practice of his invention, as well as illustrating the results obtained through its use.

EXAMPLE 1

A composition consisting of 300 grams xylene, 150 grams of a sulfonic acid commercially available under the designation LAS 99 from Pilot Chemical, and identified as dodecylbenzene sulfonic acid, and 50 grams of 1,2 dihydroxybenzene, obtained from Crown Zellerbach Corporation, San Francisco, Calif., is prepared, giving a mixture of 60 weight percent of the xylene, 30 weight percent of the sulfonic acid, and 10 weight percent of the 1,2 dihydroxybenzene. The 1,2 dihydroxybenzene is dissolved in the xylene and acid mixture by heating to 70° C. The resulting solution is a dark amber color with precipitation of a certain amount of crystalline material after two hours. Silicon semiconductor wafers metallized with aluminum have a test pattern formed using a commercially available novolak positive photoresist, obtained from KTI Chemical, Santa Clara, Calif., with exposure, development and curing in accordance with the photoresist manufacturer's instructions.

The above solution is used to strip the exposed, developed and cured pattern of the photoresist on their surfaces for fifteen seconds at 100° C. The photoresist is stripped clean, and the stripping composition is rinsable from the silicon wafers with no visual residue. The composition is then used to strip KTI Chemical commercially available isoprene negative photoresist, exposed, developed and cured in accordance with the instructions of the manufacturer, from similar aluminum metallized silicon wafers, by immersing the wafers in the composition for fifteen seconds at 100° C. The solution strips the photoresist clean, is water rinsable on the silicon wafers, and leaves no visual residue.

EXAMPLE 2

The procedure of Example 1 is repeated, except that the sulfonic acid content is increased to 35 weight percent and the 1,2,dihydroxybenzene content is decreased to 5 weight percent, by utilizing 120 g of the xylene, 7 g of the sulfonic acid and 10 g of the 1,2 dihydroxybenzene. The 1,2 dihydroxybenzene is dissolved in the xylene and sulfonic acid blend at 60° C.

Novolak positive photoresist, obtained from KTI Chemical and Shipley, is exposed, developed and cured in accordance with the instructions of its supplier in a test pattern on aluminized silicon wafers, is stripped by immersing the wafers in the above solution for one minute at 100° C. The photoresist is stripped clean, the stripper is water rinsable from the wafers and no residue is observed. This stripping composition is utilized to remove isoprene negative photoresist, obtained from KTI Chemical and Kodak, exposed, developed and cured in accordance with instructions of its supplier in patterns on aluminized silicon wafers. The wafers are immersed in the stripping composition for one minute at 100° C., stripping the negative photoresist clean from the wafers. The stripping composition is water rinsable and no visible residue on the wafers is observed.

EXAMPLE 3

The procedure of Example 2 is repeated, except that the composition contains 50 weight percent ethylenecarbonate and 25 weight percent dimethylformamide as the organic solvent, 20 weight percent of the sulfonic acid, and 5 weight percent of the 1,2 dihydroxybenzene. Equivalent results to those obtained in Example 2 are produced.

EXAMPLE 4

A life test of the composition utilized in Example 2 is carried out by utilizing KTI Chemical isoprene negative photoresist, applied, exposed, developed and cured in accordance with the instructions of its supplier. The stripping solution is maintained at temperatures between 90° and 120° C. for an interim of from zero to seven and one-half hours, with immersion of the silicon wafers in the solution for times of 15, 30 and 60 seconds. Results are shown in the following table:

| | | BATH TEMPERATURE, °C. | | |
|---|---|---|---|---|
| Interval/Strip Time | | 90–100 | 100–110 | 110–120 |
| 0 Hr. | 15 sec. | Resist | Resist | Clean |
| | 30 sec. | Resist | Clean | Clean |
| | 60 sec. | Some resist | Clean | Clean |
| 2 Hr. | 15 sec. | Some rinse spots | Some rinse spots | Clean |
| | 30 sec. | Clean | Clean | Streak from dirt |
| | 60 sec. | Clean | Clean | Clean |
| 4 Hr. | 15 sec. | Spots | Some spots on edges | Clean |
| | 30 sec. | Clean | Residue on edge | Clean |

-continued

| Interval/Strip Time | BATH TEMPERATURE, °C. | | |
|---|---|---|---|
| | 90-100 | 100-110 | 110-120 |
| 60 sec. | Clean | Residue on edge | Residue on edge |
| 6 Hr. 15 sec. | Clean | Very clean | Clean |
| 30 sec. | Edge spots | Edge spots | Clean |
| 60 sec. | Edge spots | Very clean | Clean |
| 7¼ Hr. 15 sec. | Residues | Residues | Residues |
| 30 sec. | Spots on edge | Spots on edge | Spots on edge |
| 60 sec. | Spots on edge | Spots on edge | Spots on edge |

These results show that the resist composition is suitable for use under production conditions encountered in the manufacture of integrated circuits, with some deterioration in performance after the composition is maintained at an elevated temperature for several hours.

Substitution of other solvents and organic sulfonic acids as described above in the procedure of the above Examples, gives similar advantageous results.

It should now be apparent to those skilled in the art that a novel photoresist stripping composition and method capable of achieving the stated objects of this invention has been provided. At least equivalent results are obtained with the composition and method of this invention as compared with results achieved utilizing the sulfonic acid, phenol and chlorinated hydrocarbon solvent photoresist stripping composition in general use in the manufacture of integrated circuits. No attack on aluminum metallurgy or silicon dioxide insulators on silicon wafers is observed with the present invention.

It should further be apparent to those skilled in the art that various changes in form and details of the invention as described may be made. It is intended that such changes be included within the spirit and scope of the claims appended hereto.

What is claimed is:

1. A composition for the removal of an organic photoresist from a substrate, which consists essentially of: an organic sulfonic acid and 1,2 dihydroxybenzene in sufficient amounts to remove the photoresist from the substrate.

2. The composition of claim 1 additionally comprising a nonpolar, or polar organic solvent.

3. The composition of claim 2 in which the nonpolar, organic solvent is an aromatic or alkylaromatic solvent containing from 6 to 20 carbon atoms.

4. The composition of claim 1 in which the organic sulfonic acid is present in an amount of from about 20 to about 90 weight percent, the 1,2 dihydroxybenzene is present in an amount of from about 0.1 to about 20 weight percent and a nonpolar organic solvent is present from 0 to about 60 weight percent.

5. The composition of claim 4 comprising from about 30 to about 60 weight percent of the organic sulfonic acid and from about 3 to about 15 weight percent of the 1,2 dihydroxybenzene.

6. The composition of claim 5 comprising about 35 weight percent of the organic sulfonic acid, about 5 weight percent of the 1,2 dihydroxybenzene, and about 60 weight percent of the nonpolar organic solvent.

7. The composition of claim 6 in which the nonpolar organic solvent is xylene.

8. A method of stripping photoresist from a substrate, which comprises contacting the photoresist with the composition of claim 1 at a temperature between about 20° and about 150° C.

9. The method of claim 8 wherein the substrate is a metallized inorganic substrate.

10. The method of claim 9 wherein the substrate is a silicon wafer having a silicon dioxide insulation layer metallized with aluminum.

* * * * *